(12) United States Patent
Ando et al.

(10) Patent No.: US 8,420,473 B2
(45) Date of Patent: Apr. 16, 2013

(54) REPLACEMENT GATE DEVICES WITH BARRIER METAL FOR SIMULTANEOUS PROCESSING

(75) Inventors: Takashi Ando, Tuckahoe, NY (US);
Michael P. Chudzik, Danbury, CT (US);
Siddarth A. Krishnan, Peekskill, NY (US); Unoh Kwon, Fishkill, NY (US);
Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 12/960,586

(22) Filed: Dec. 6, 2010

(65) Prior Publication Data

US 2012/0139053 A1      Jun. 7, 2012

(51) Int. Cl.
| H01L 21/8238 | (2006.01) |
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .................. 438/199; 257/369; 257/E21.632; 257/E27.062

(58) Field of Classification Search .................. 438/199; 257/369, E21.632, E27.062
See application file for complete search history.

(56) References Cited

U.S. PATENT DOCUMENTS

| 6,921,711 | B2 | 7/2005 | Cabral, Jr. |
| 7,056,782 | B2 | 6/2006 | Amos |
| 7,091,118 | B1 | 8/2006 | Pan |
| 7,242,055 | B2 | 7/2007 | Bojarczuk, Jr. |
| 7,271,455 | B2 | 9/2007 | Cabral, Jr. |
| 7,411,227 | B2 | 8/2008 | Amos |
| 7,432,567 | B2 | 10/2008 | Doris |
| 7,488,656 | B2 | 2/2009 | Cartier |
| 7,498,271 | B1 | 3/2009 | Donaton |
| 7,569,466 | B2 | 8/2009 | Callegari |
| 7,611,979 | B2 | 11/2009 | Callegari |
| 7,655,557 | B2 | 2/2010 | Amos |
| 7,666,732 | B2 | 2/2010 | Doris |
| 7,709,902 | B2 | 5/2010 | Doris |
| 7,718,496 | B2 | 5/2010 | Frank |
| 7,723,798 | B2 | 5/2010 | Doris |
| 7,732,872 | B2 | 6/2010 | Cheng |
| 7,754,594 | B1 | 7/2010 | Chudzik |
| 7,785,999 | B2 | 8/2010 | Cabral, Jr. |
| 7,790,559 | B2 | 9/2010 | Adkisson |

(Continued)

*Primary Examiner* — David S Blum
(74) *Attorney, Agent, or Firm* — Daryl K. Neff; H. Daniel Schnurmann

(57) ABSTRACT

A method of simultaneously fabricating n-type and p type field effect transistors can include forming a first replacement gate having a first gate metal layer adjacent a gate dielectric layer in a first opening in a dielectric region overlying a first active semiconductor region. A second replacement gate including a second gate metal layer can be formed adjacent a gate dielectric layer in a second opening in a dielectric region overlying a second active semiconductor region. At least portions of the first and second gate metal layers can be stacked in a direction of their thicknesses and separated from each other by at least a barrier metal layer. The NFET resulting from the method can include the first active semiconductor region, the source/drain regions therein and the first replacement gate, and the PFET resulting from the method can include the second active semiconductor region, source/drain regions therein and the second replacement gate.

21 Claims, 13 Drawing Sheets

U.S. PATENT DOCUMENTS

| | | |
|---|---|---|
| 7,790,592 B2 | 9/2010 | Chen |
| 7,807,525 B2 | 10/2010 | Doris |
| 2008/0203485 A1 | 8/2008 | Chudzik |
| 2008/0311745 A1 | 12/2008 | Amos |
| 2009/0152650 A1 | 6/2009 | Chudzik |
| 2009/0294920 A1 | 12/2009 | Chudzik |
| 2009/0302396 A1 | 12/2009 | Chen |
| 2009/0308636 A1 | 12/2009 | Chudzik |
| 2010/0038725 A1 | 2/2010 | Chudzik |
| 2010/0044805 A1 | 2/2010 | Callegari |
| 2010/0159684 A1 | 6/2010 | Chang et al. |
| 2010/0187610 A1 | 7/2010 | Kwon |
| 2010/0187643 A1 | 7/2010 | Chudzik et al. |
| 2010/0200937 A1 | 8/2010 | Bedell et al. |
| 2010/0244206 A1 | 9/2010 | Bu et al. |
| 2010/0264495 A1 | 10/2010 | Mo et al. |
| 2012/0126295 A1* | 5/2012 | Edge et al. .................. 257/288 |

* cited by examiner

REPLACEMENT GATE DEVICES WITH BARRIER METAL FOR SIMULTANEOUS PROCESSING

BACKGROUND OF THE INVENTION

The subject matter of the present application relates to semiconductor devices of integrated circuits and their fabrication, particularly field effect transistors.

One of the ways proposed to improve performance in complementary metal oxide semiconductor ("CMOS") technology integrated circuits is to provide a high dielectric constant, i.e., "high-k" gate dielectric layer, for n-type and p-type field effect transistors ("NFET" and "PFET" devices), and to form metal gates of the NFET and PFET devices.

However, differences in the workfunctions of NFET and PFET devices typically require different metal layers to be provided in the gates of respective N- or P-type transistors. Heretofore, methods for forming the gates of N- and P-type transistors have been cumbersome. Further improvements in the fabrication of N- and P-type transistors having metal gates can be made.

SUMMARY OF THE INVENTION

Figure 1:
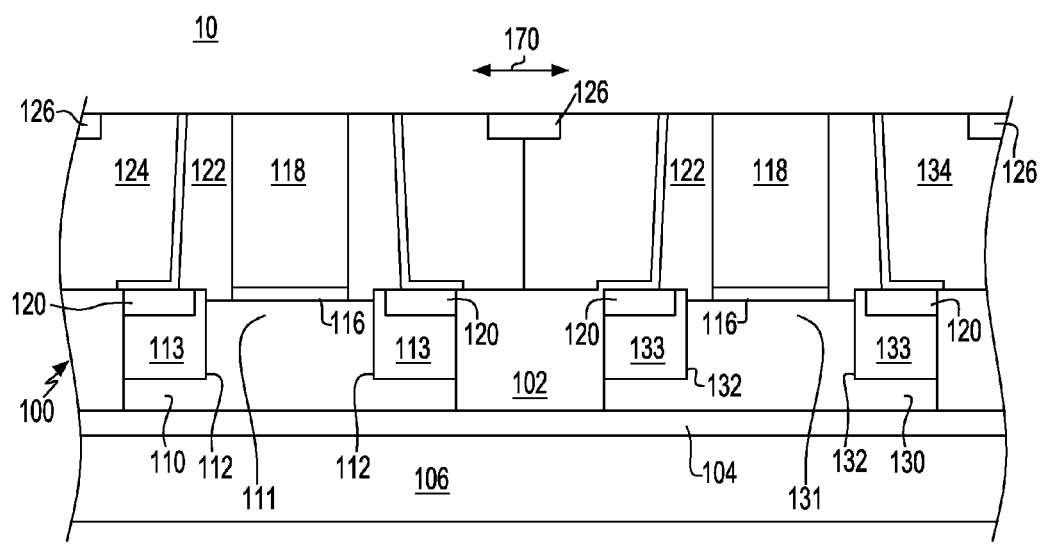
FIG. 1 is a sectional view illustrating a preliminary stage in a replacement gate method of fabricating an integrated circuit including an NFET and a PFET according to an embodiment of the invention.

According to an aspect of the invention, a method is provided for simultaneously fabricating n-type and p type field effect transistors. Such method can include removing first and second sacrificial gates from within first and second openings in a dielectric region overlying first and second active semiconductor regions of a substrate, wherein source/drain regions are disposed within the first and second active semiconductor regions adjacent the first and second openings. The method can further include forming first and second replacement gates within the first and second openings, respectively, including forming the first replacement gate having a first gate metal layer adjacent a gate dielectric layer within the first opening overlying the first active semiconductor region and forming the second replacement gate having a second gate metal layer adjacent a gate dielectric layer within the second opening overlying the second active semiconductor region. The step of forming can further include stacking at least portions of the first and second gate metal layers in a direction of their thicknesses with at least a barrier metal layer separating the at least portions of the gate metal layers. The n-type and p-type field effect transistors then are completed, with the n-type field effect transistor including the first active semiconductor region, the source/drain regions therein and the first replacement gate, and the p-type field effect transistor including the second active semiconductor region, the source/drain regions therein and the second replacement gate.

In accordance with another aspect of the invention, a microelectronic element including a semiconductor chip is provided which includes an n-type field effect transistor (NFET) having a gate including a first metal layer and having a current path in a monocrystalline semiconductor region of the semiconductor chip; and a p-type field effect transistor (PFET) having a gate including a second metal different from the first metal and having a current path in a monocrystalline region of the semiconductor chip. The gate of at least one of the NFET and the PFET includes both the first metal and the second metal and a barrier metal layer which separates the first metal from the second metal. The gates may consist essentially of at least one of a metal, or a conductive compound of a metal other than silicide.

In accordance with another aspect of the invention, a microelectronic element including: a semiconductor chip is provided which includes an n-type field effect transistor (NFET) having a gate overlying a gate dielectric including first ions of a first metal, the NFET having a current path in a monocrystalline region of the semiconductor chip; and a p-type field effect transistor (PFET) having a gate overlying a gate dielectric including second ions of a second metal different from the first metal, the PFET having a current path in a monocrystalline region of the semiconductor chip, the gates consisting essentially of at least one of a metal, or a conductive compound of a metal other than silicide. The gate of at least one of the NFET or the PFET includes a first layer including a metal or an electrically conductive compound of a metal, a second layer including a metal or an electrically conductive compound of a metal, and includes a barrier metal layer which separates the first layer from the second layer.

DETAILED DESCRIPTION

FIG. 1 illustrates a structure which can represent a preliminary stage in a method of simultaneously fabricating n-type and p type field effect transistors in accordance with an embodiment of the invention. As illustrated in FIG. 1 are a first monocrystalline active semiconductor region 110 of a substrate 100 in which an n-type field effect transistor ("NFET") is to be formed, and a second monocrystalline active semiconductor region 130 in which a p-type field effect transistor ("PFET") is to be formed. In one embodiment, the active semiconductor regions 110, 130 may overlie a buried dielectric layer 104, which in turn may separate the active semiconductor regions from a bulk semiconductor region 106 of the substrate. In another embodiment, the buried dielectric layer 104 can be omitted such that the active semiconductor regions are contiguous with the bulk semiconductor region.

The NFET and the PFET are separated in a lateral direction 170 of the substrate by an isolation region 102, which can be a shallow trench isolation region, for example. The first monocrystalline active semiconductor region 110 has a current path therein which includes a first semiconductor region 111 having first and second opposite edges 112, and source/drain regions 113 adjacent to the first and second edges. The source/drain regions 113 of the first active semiconductor region 110 may have an n-type dopant concentration of sufficient magnitude to serve as source/drain regions of an NFET to be fabricated in the first active semiconductor region 110. Similarly, the second monocrystalline active semiconductor region 130 has a current path therein which includes a second semiconductor region 131 having first and second opposite edges 132 and source/drain regions 133 adjacent to the first and second edges. The source/drain regions 133 of the second active semiconductor region 130 may have a p-type dopant concentration of sufficient magnitude to serve as source/drain regions of a PFET to be fabricated in the second active semiconductor region 130. As further shown in FIG. 1, a relatively thin dielectric layer 116, e.g., an oxide layer, can overlie the first and second active semiconductor regions. In one embodiment, the thin dielectric layer 116 can be a sacrificial layer which will be removed by subsequent processing. A sacrificial gate layer 118 can overlie the thin dielectric layer 116. In one embodiment, the sacrificial gate layer 118 can consist essentially of a doped or undoped polycrystalline semiconductor material such as polysilicon. In FIG. 1, although the same reference numerals 116 and 118 are used for these layers overlying the first and second semiconductor regions, such layers 116 and 118 can have the same or different compositions and not all or different ones of such layers can be present overlying respective ones of the first and second semiconductor regions 111, 131.

As further shown in FIG. 1, in one embodiment, at least portions of the source/drain regions 113, 133 can include stressors of semiconductor material embedded therein. For example, the source/drain regions 113 for the NFET can include an alloy of silicon such as silicon carbide. When provided in source/drain regions at locations opposite each other across a region therebetween, an alloy such as silicon carbide in sufficient quantity can apply a tensile stress to the region 111 therebetween. Similarly, the source/drain regions 133 for the PFET can include an alloy of silicon such as silicon germanium. When provided in source/drain regions at locations opposite each other across a region therebetween, an alloy such as silicon germanium in sufficient quantity can apply a compressive stress to the region 131 therebetween. Silicide regions 120 may overlie at least portions of the source/drain regions 113, 133. In one embodiment, the silicide regions can include a layer of nickel platinum silicide (NiPtSi) exposed at a surface of the source/drain regions 113, 133. In other embodiments, the silicide regions 120 can include a silicide of a metal which reacts with silicon and heat, which metal can be selectively removed from surfaces not in contact with the silicon after forming the silicide. For example, such metal can be, without limitation, one or more of the following: tungsten, titanium, nickel, platinum, cobalt, and palladium.

As further shown in FIG. 1, spacers 122 can extend along walls of the sacrificial gates 118 overlying each active semiconductor region 110, 130. A first dielectric stressor layer 124 can overlie portions of the first active semiconductor region 110 beyond the spacers 112 adjacent to such region 110, and a second dielectric stressor layer 134 can overlie portions of the second active semiconductor region 130 beyond the spacers 112 adjacent to such region 130. Portions of another dielectric layer such as an interlevel dielectric layer 126 may cover the first and second active semiconductor regions and generally also other devices as well.

A structure 10 such as that shown in FIG. 1 typically is formed by a series of fabrication steps similar to those used in simultaneously fabricating NFET and PFET transistors on the same substrate, except that at least sacrificial gate layer 118 can be removed during subsequent processing in forming "replacement gate" structures which are customized to requirements of the NFET and the PFET to be formed by such subsequent processing. As will be described below, the replacement gate structures can have particular structures from which it can be possible to infer the methods by which they have been made.

Figure 2:
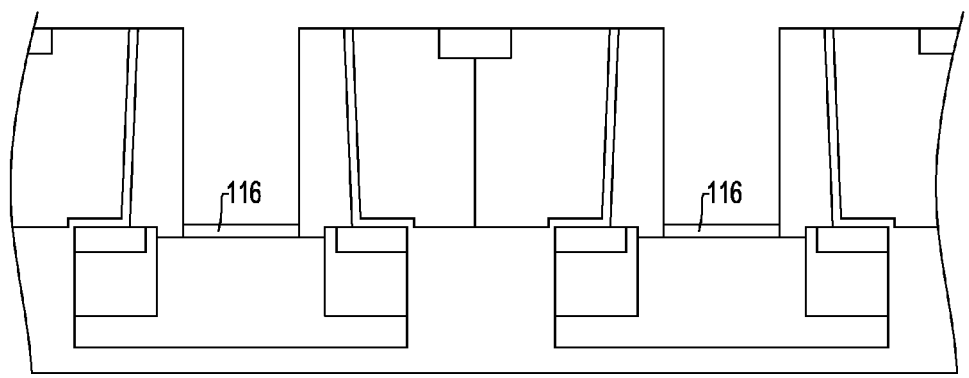
FIG. 2 is a sectional view illustrating a stage subsequent to the stage illustrated in FIG. 1 in a method of fabrication according to an embodiment of the invention.

FIG. 2 illustrates a stage of fabrication subsequent to the stage illustrated in FIG. 1 in which the sacrificial gate layer has been removed. Also, the thin dielectric layer 116 (FIG. 1) may have been partially or fully removed. In one embodiment, the sacrificial layer can be removed selectively relative to one or more dielectric materials of the spacers 122 adjacent thereto, as well as selectively relative to the thin dielectric layer 116 when present. Subsequently, in a particular embodiment, the thin dielectric layer 116 can be removed selectively relative to the semiconductor material 111 and 131 beneath.

Figure 3:
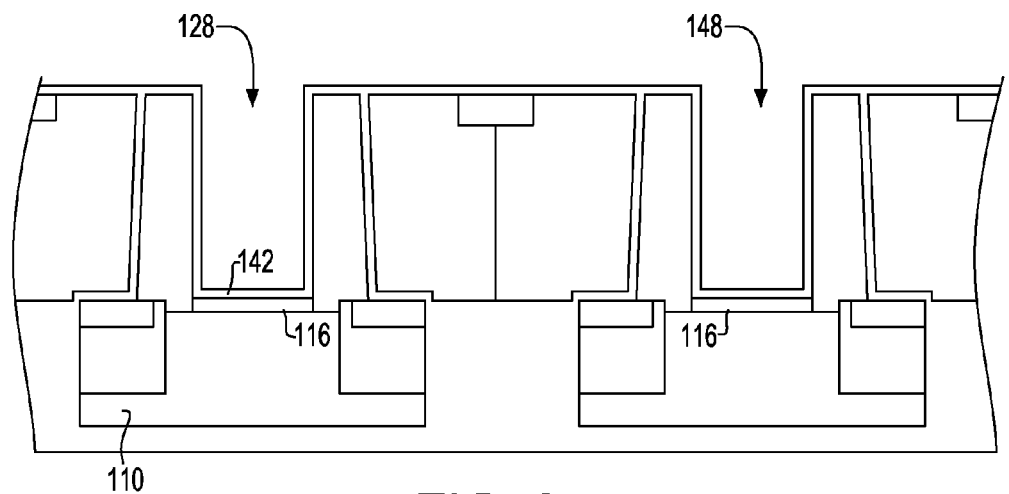
FIG. 3 is a sectional view illustrating a stage subsequent to the stage illustrated in FIG. 2 in a method of fabrication according to an embodiment of the invention.

Thereafter, as shown in FIG. 3, a dielectric layer 142 can be formed overlying the thin dielectric layer 116 over the first and second active semiconductor regions 110, 130. Alternatively, dielectric layer 116 can be removed, and dielectric layer 142 can be formed in place of such layer. In one embodiment, the dielectric layer 142 can include a high dielectric constant or "high-k" dielectric material having a dielectric constant higher than silicon nitride. For example, the dielectric layer 142 can include one or more of the following dielectric materials: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Typically, such dielectric layer is deposited by chemical vapor deposition (CVD) or atomic layer deposition (ALD). The dielectric layer typically deposits onto all exposed surfaces, including within gate openings 128, 148 overlying the first and second active semiconductor regions 110, 130, and onto thin dielectric layer 116, when present within the gate openings.

Figure 4:
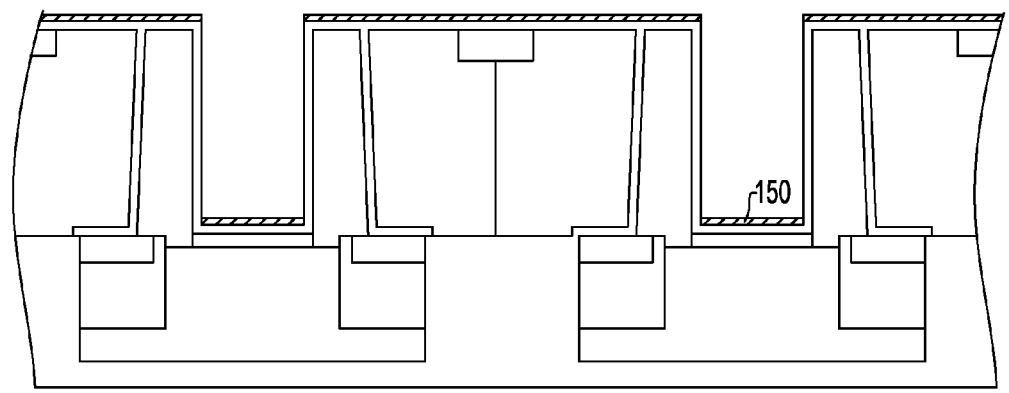
FIG. 4 is a sectional view illustrating a stage subsequent to the stage illustrated in FIG. 3 in a method of fabrication according to an embodiment of the invention.

Subsequently, as illustrated in FIG. 4, a $V_T$ adjustment layer 150 of metal, a conductive compound of a metal, or dielectric can be deposited for the purpose of providing a "cap layer" to enhance a property of the high-k gate dielectric of the PFET to be fabricated using the second active semiconductor region 130. As seen in FIG. 4, the layer 150 can be deposited by physical vapor deposition, sputtering, chemical vapor deposition, which may or may not be enhanced by plasma, or atomic layer deposition for example. In one embodiment, the layer 150 can include a metal such as aluminum (Al), or an alloy of aluminum, or both, each which is suitable for enhancing a property of a high-k gate dielectric layer of a PFET, hereinafter referred to as a "P-cap layer". The layer 150 may also include another layer such as titanium nitride (hereinafter, "TiN") or their alloy, or the layer 150 may include multiple layers including one or more layers of aluminum, aluminum alloy, TiN or other suitable metal. Layer 150 can serve as a source of dopant ions primarily for setting or adjusting a threshold voltage of the PFET. In one embodiment, the P-cap layer, e.g., aluminum, can be deposited directly on the dielectric layer 142, or, in another embodiment, an intermediate layer, e.g., TiN, can be deposited directly on the dielectric layer 142, after which the P-cap layer can be deposited. In another embodiment, the P-cap layer can be located between two intermediate layers. In subsequent processing, the intermediate layer can help avoid aluminum from directly contacting the high-K gate dielectric 142 to be formed for the NFET device.

Figure 5:
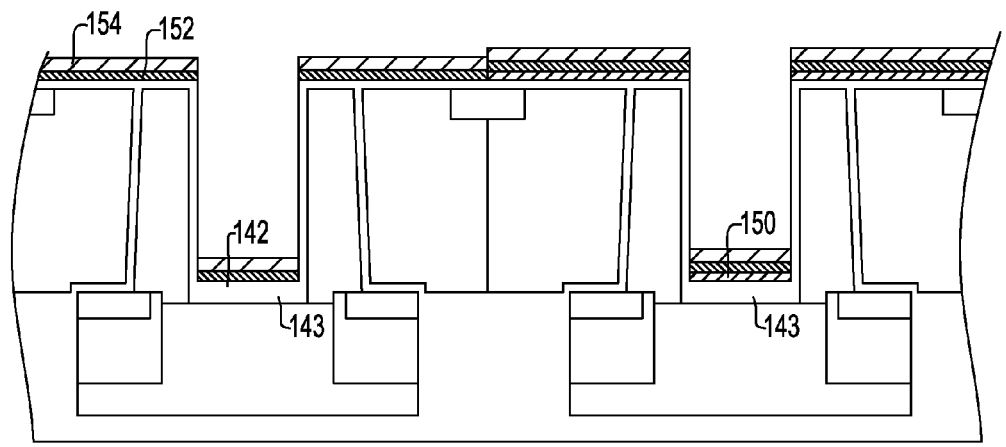
FIG. 5 is a sectional view illustrating a stage subsequent to the stage illustrated in FIG. 4 in a method of fabrication according to an embodiment of the invention.
Figure 6:
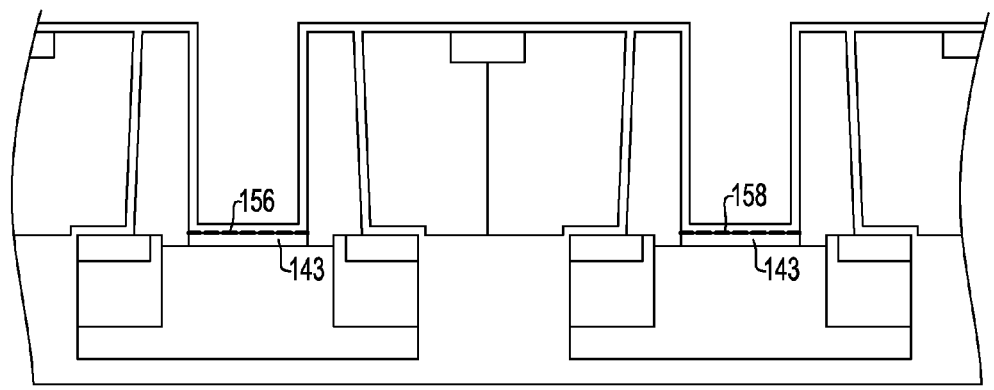
FIG. 6 is a sectional view illustrating a stage subsequent to the stage illustrated in FIG. 5 in a method of fabrication according to an embodiment of the invention.

Referring to FIG. 5, subsequently, the $V_T$ adjustment layer 150, is patterned so that after patterning, the remaining portion of this stack is present over the second active semiconductor region 130, but is not present over the first active semiconductor region 110. The patterning of the stack can be performed, for example, by applying and lithographically patterning a photoresist (not shown), transferring the pattern in the photoresist into the stack, and then removing the photoresist. The transfer of the pattern can be performed by etching selectively to the material of the thin dielectric layer 116, when present, using wet or dry etching processes or a combination thereof. Thereafter, as seen in FIG. 5, a second $V_T$ adjustment layer 152 can be deposited. The second metal layer can be one that is suitable for enhancing a property of a high-k gate dielectric layer 142 of an NFET. The second metal layer can include a metal such as lanthanum (La), lanthanum oxide, or magnesium oxide, for example (hereinafter, referred to herein alternatively as "N-cap layer"). Like the P-cap layer, the N-cap layer can include another layer 154, such as a layer of TiN deposited over the N-cap layer. N-cap layer 152 can serve as a source of dopant ions primarily for setting or adjusting a threshold voltage of the NFET. Then, the substrate having the structure seen in FIG. 5 can be annealed, i.e., heated to a temperature sufficient to drive ions from the P-cap and N-cap layers into the high-k gate dielectric layer 142, where at least some ions from the P-cap and N-cap layers are driven downwards towards the first and second semiconductor regions 111, 131. FIG. 6 illustrates a stage of fabrication subsequent to the anneal discussed relative to FIG. 5, showing, with dashed line 156, the presence of ions of the N-cap layer near an interface 143 between the gate dielectric layer 142 and the first semiconductor region 111. In addition, ions of the P-cap layer, shown with dashed line 158, are disposed near an interface between the gate dielectric layer 142 and the second semiconductor region 131. Thereafter, the N- and P-cap layers remaining on top of the gate dielectric layer 142 can be removed selectively relative to the gate dielectric layer 142 leaving the structure as shown in FIG. 6.

Figure 7:
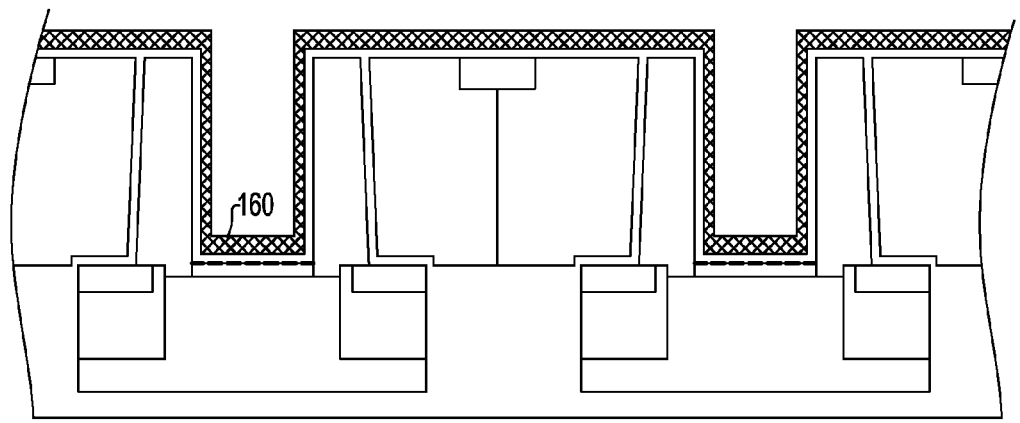
FIG. 7 is a sectional view illustrating a stage subsequent to the stage illustrated in FIG. 6 in a method of fabrication according to an embodiment of the invention.
Figure 8:
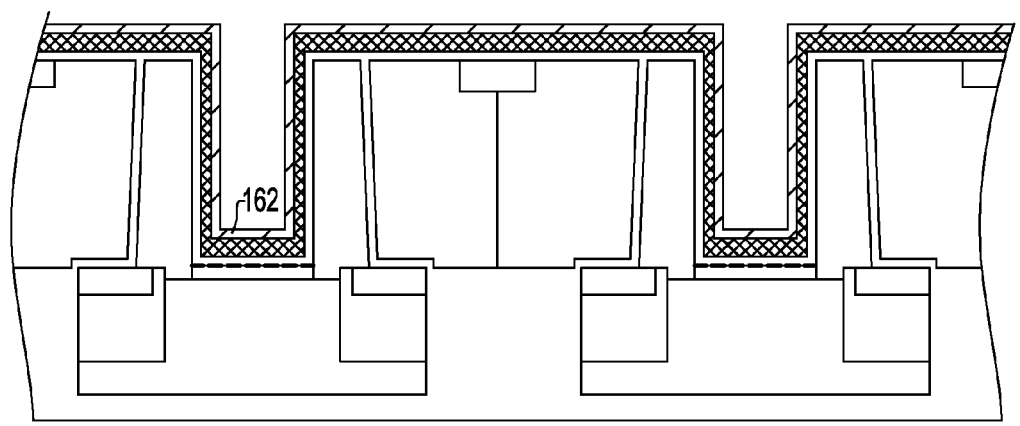
FIG. 8 is a sectional view illustrating a stage subsequent to the stage illustrated in FIG. 7 in a method of fabrication according to an embodiment of the invention.

Thereafter, a first gate metal layer 160 can be deposited on all exposed surfaces to form the structure as seen in FIG. 7, the first gate metal layer as a workfunction setting metal layer for the PFET, referred to herein alternatively as a "P-gate metal layer" or as a "PWF metal layer". In one embodiment, the first gate metal layer 160 can be a layer of titanium nitride (TiN). A barrier metal layer 162 then can be deposited to overlie the first gate metal layer 160. In one example, the barrier metal layer can be tantalum nitride (TaN), although other suitable barrier metal layers can be used. In a particular embodiment, the barrier metal layer 162 can be formed by atomic layer deposition (ALD) and can be formed to a thickness of 5 angstroms to 50 angstroms.

Figure 9:
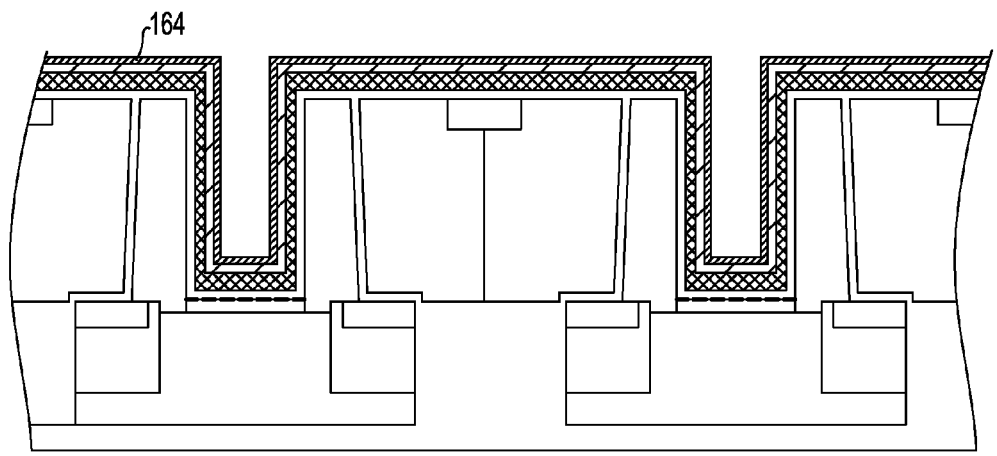
FIG. 9 is a sectional view illustrating a stage subsequent to the stage illustrated in FIG. 8 in a method of fabrication according to an embodiment of the invention.
Figure 10:
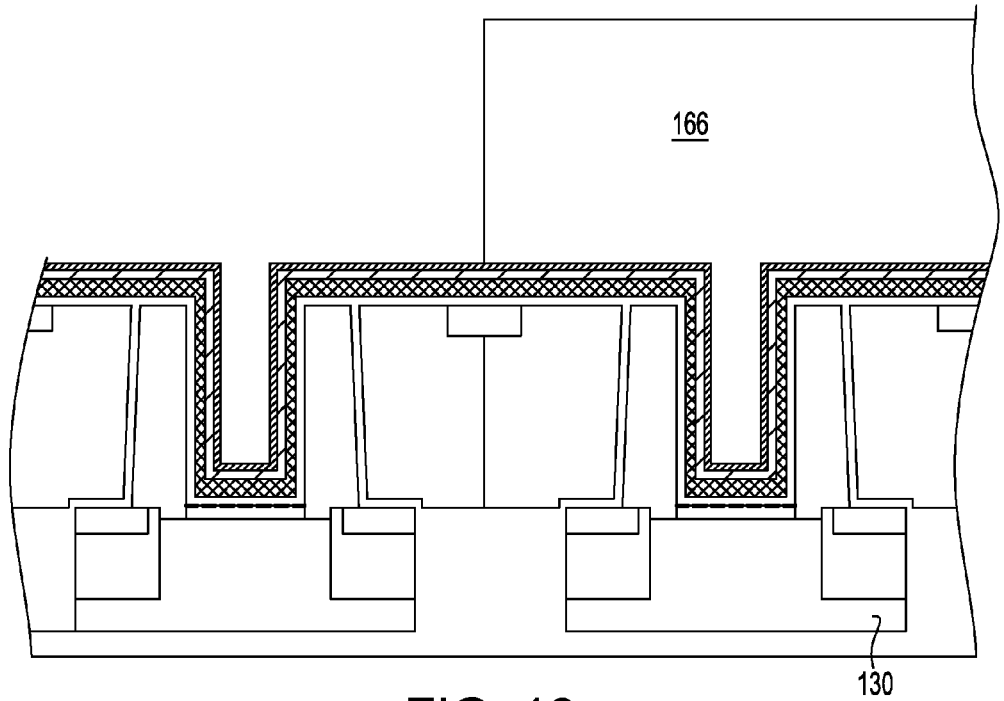
FIG. 10 is a sectional view illustrating a stage subsequent to the stage illustrated in FIG. 9 in a method of fabrication according to an embodiment of the invention.

FIG. 9 shows a subsequent stage of fabrication in which a hard mask 164 is deposited to cover the barrier metal layer 162. In particular embodiments, the hard mask can be an oxide such as silicon dioxide, for example. The hard mask can be a silicon oxide layer formed by a low temperature deposition process such as deposition from a TEOS (tetraethylorthosilicate) precursor, among others. Alternatively, the hard mask can be formed by an ALD process. Thereafter, as seen in FIG. 10, a layer of resist, e.g., a photoresist layer, can be formed as a resist mask 166 atop a portion of the substrate including the second active semiconductor region 130. Such mask can be formed by depositing and subsequently patterning a resist layer, such as by a photolithographic exposure method.

Figure 11:
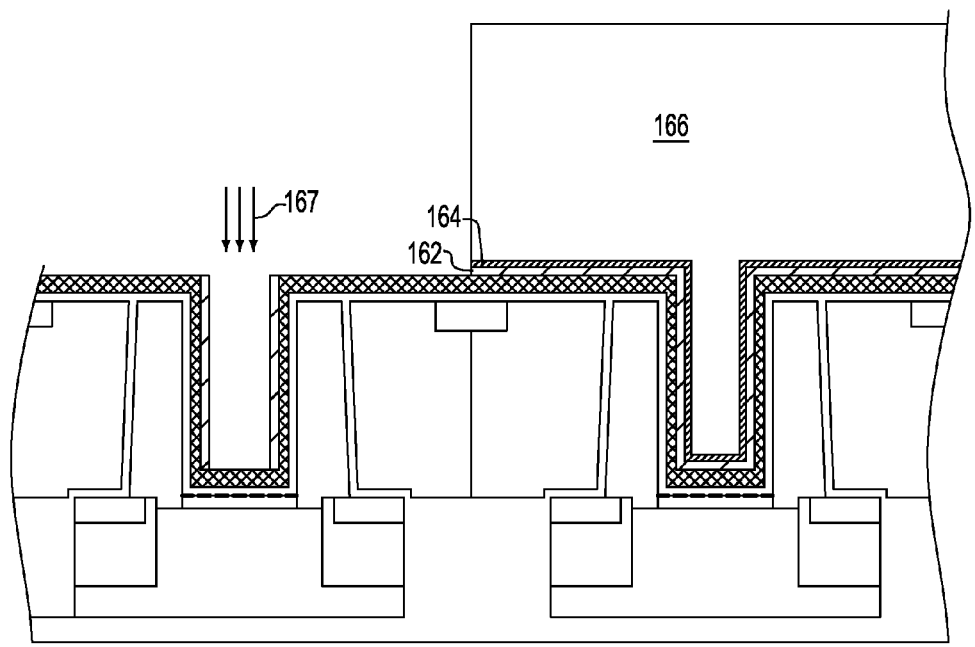
FIG. 11 is a sectional view illustrating a stage subsequent to the stage illustrated in FIG. 10 in a method of fabrication according to an embodiment of the invention.

Thereafter, as seen in FIG. 11, portions of the hard mask 164 and the barrier metal layer 162 thereunder which are not covered by the resist mask can be removed, such as by performing an anisotropic etch process primarily in a vertical direction (in direction of arrows 168). In one embodiment, the anisotropic etch process can be a reactive ion etch ("RIE") process.

Figure 12:
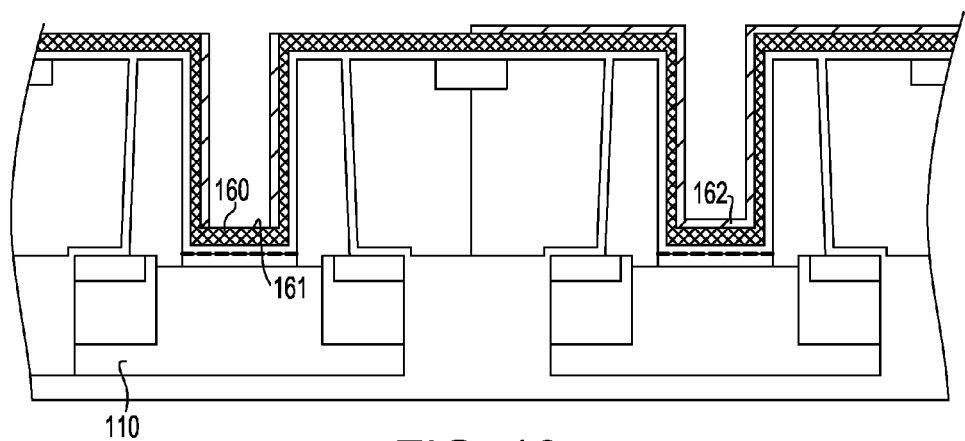
FIG. 12 is a sectional view illustrating a stage subsequent to the stage illustrated in FIG. 11 in a method of fabrication according to an embodiment of the invention.

FIG. 12 shows a stage of fabrication subsequent to FIG. 11 in which the resist mask, and remaining portions of the hard mask are removed selectively to the barrier metal layer 162 and P-gate metal layer 160 which remain thereon. For example, the resist mask 166 can be removed by an appropriate solvent, and a hydrofluoric acid ("HF")-based etchant can be used to remove an oxide hard mask selectively with respect to the metal layers 160, 162. At this stage, a surface 161 of the P-gate metal layer 160 is exposed overlying the first active semiconductor region 110.

Figure 13:
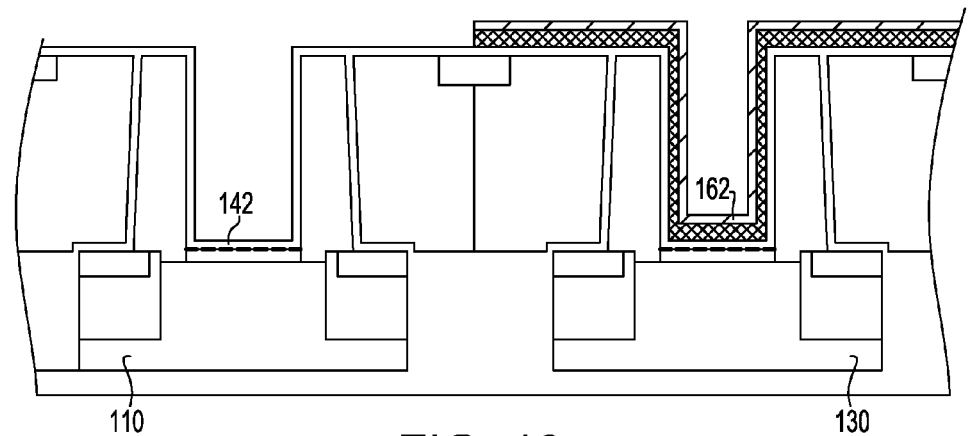
FIG. 13 is a sectional view illustrating a stage subsequent to the stage illustrated in FIG. 12 in a method of fabrication according to an embodiment of the invention.

Thereafter, the P-gate metal layer is removed from above the first active semiconductor region 110 to expose the high-k gate dielectric layer 142 as seen in FIG. 13. This removal process can be performed selectively relative to the barrier metal layer 162 such that the barrier metal layer 162 and the P-gate metal layer remain over the second active semiconductor region 130.

Figure 14:
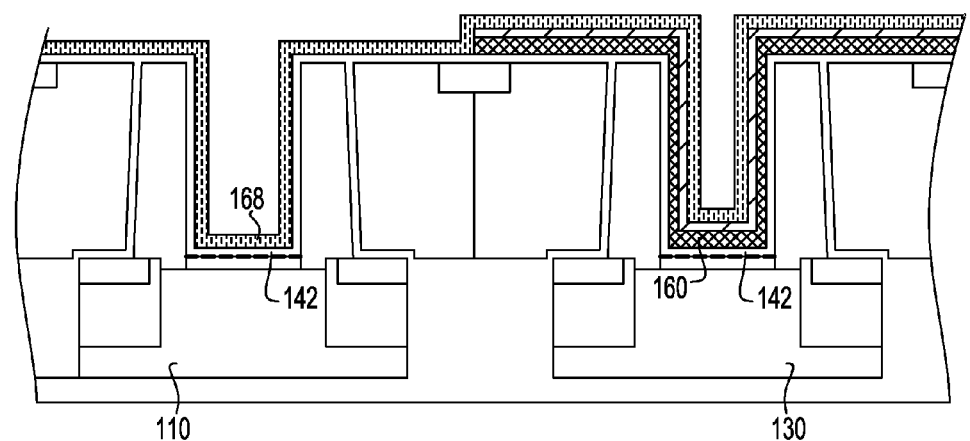
FIG. 14 is a sectional view illustrating a stage subsequent to the stage illustrated in FIG. 13 in a method of fabrication according to an embodiment of the invention.

FIG. 14 shows a further stage of fabrication in which a second gate metal layer 168 suitable for setting a workfunction for the NFET (hereinafter referred to herein alternatively as an "NWF metal layer" or "N-gate metal layer") is deposited over the structure including above the high-k gate dielectric layer 142 overlying the first active semiconductor region 110. The N-gate metal layer 168 may directly contact the high-k gate dielectric layer 142 above the first active semiconductor region 110, just as the P-gate metal layer 160 may directly contact the high-k gate dielectric layer 142 above the second active semiconductor region 130.

Figure 15:
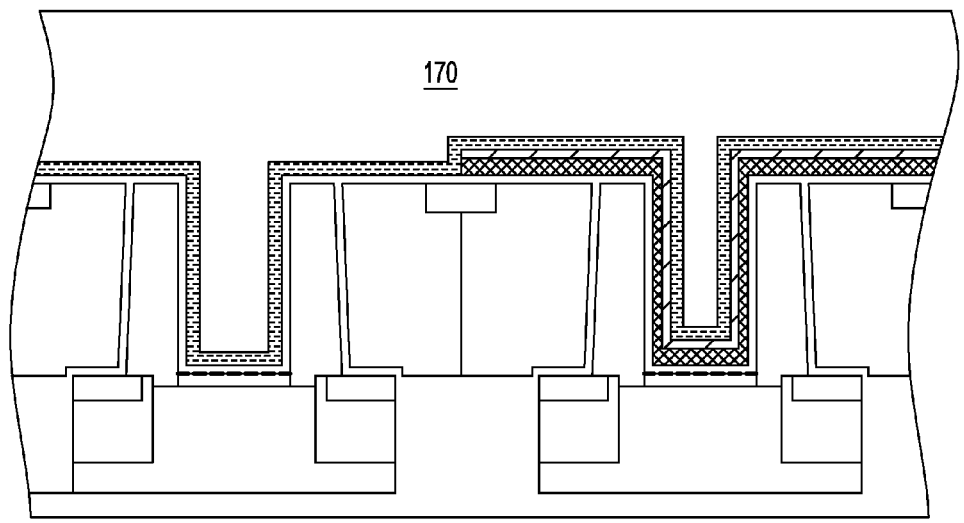
FIG. 15 is a sectional view illustrating a stage subsequent to the stage illustrated in FIG. 14 in a method of fabrication according to an embodiment of the invention.

Thereafter, referring to FIG. 15, further processing can be performed to complete the gates of the NFET and the PFET. Specifically, a metal seal layer, a wetting layer, and a seed layer can be deposited. However, not all such layers need be deposited in every case. Thereafter, a gate fill layer 170 can be deposited, which in one example can be a layer of aluminum deposited, e.g., by physical vapor deposition, resulting in the structure as seen in FIG. 15.

Figure 16:
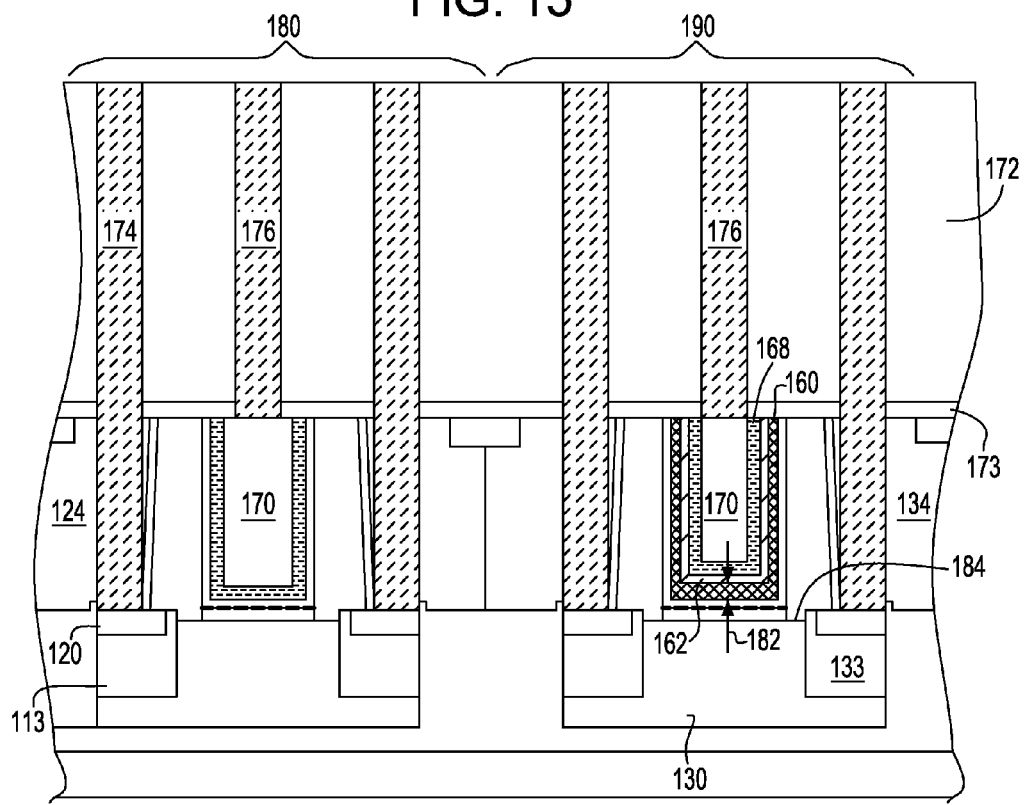
FIG. 16 is a sectional view illustrating a stage subsequent to the stage illustrated in FIG. 15 in a method of fabrication according to an embodiment of the invention.

Then, as seen in FIG. 16, excess metal overlying the dielectric layers of the structure, i.e., any metal which overlies the dielectric stressor layers 124, 134 can be removed from the structure, such as by a chemical mechanical polishing ("CMP") process arranged to stop when surfaces of the stressor layers become exposed. For example, a CMP process can be timed or endpointed to stop after exposing surfaces of the dielectric stressor layers 124, 134. Thereafter, as further seen in FIG. 16, an optional dielectric cap layer 173 and an inter-level dielectric (ILD) layer 172 can be formed to overlie the structure, after which electrically conductive contact vias 174 can be formed which extend through the ILD layer 172 to electrically contact at least either the silicide regions 120 or the source/drain regions 113, 133 of an NFET 180 or a PFET 190. Electrically conductive contact vias 176 can be formed which extend through the ILD layer 172 to electrically contact gates of the NFET 180 and the PFET 190, e.g., by electrically contacting the metal layer 170 of each gate. In such way, the NFET and PFET can be completed. Further electrical interconnection to and between the NFET and PFET can be established by forming electrical conductors in additional metal layers (not shown) such as can be disposed in the ILD 172 and additional ILD layers (not shown) overlying ILD 172.

As further seen in FIG. 16, the first and second gate metal layers 160, 168 can be deposited to overlie a major surface 184 of the substrate. Above the second active semiconductor region 130 in which the PFET has a path for the flow of current, the first and second gate metal layers can be vertically stacked, i.e., stacked in a direction of a thickness 182 of the metal layer 160 away from the major surface 184. Where they are vertically stacked, the first and second gate metal layers 160, 168 can be separated by a barrier metal layer 162. However, as further seen in FIG. 16, only one of the first and second gate metal layers may overlie the first active semiconductor region in which the NFET has a path for the flow of current. When processing finishes (FIG. 16), the thus formed gates of the PFET and the NFET are replacement gates thereof.

In one variation of the above-described method, the formation of the silicide layer 120 can be delayed until after the heating step discussed above relative to FIG. 5. In that way, it may be possible to perform such heating step at a higher temperature, because then the heating step will not cause the silicide layer 120 (FIG. 16) to spread excessively into the source/drain regions 113, 133, or cause ions from the metal layer used to form the silicide layer to spread excessively into the source/drain regions 113, 133. In such case, in the initial structure (FIG. 1), a dielectric layer can be provided beyond edges of the spacers 122 in place of the dielectric stressor layers 124, 134, such dielectric layer overlying the source/drain regions 113, 133. After the above-described processing (FIGS. 1 through 5) or at a later stage of processing, such dielectric layer can be removed such that the source/drain regions 113, 133 become exposed. Then, the silicide regions 120 can be formed by a self-aligned process. In one example, the silicide regions can be formed after the stage of processing described above relative to FIG. 16. After forming the source/drain regions, dielectric stressor layers 124, 134 can be formed. In another variation of any of the above-described embodiments, the processing used to adjust the threshold voltages of the NFET and PFET described above with reference to FIGS. 4, 5, and 6, can be performed before forming the high-K gate dielectric layer 142. In this case, the thin dielectric layer 116 is not removed after removing the sacrificial gates 118 (FIG. 1). Then, the P-cap layer and N-cap layer will be formed as described above (FIGS. 4-5), and dopant ions from each of the P-cap and N-cap layers then are driven into the structure by annealing as described above (FIGS. 5-6) such that ions (shown at 156 and 158) of the respective N-cap and P-cap layers are present near interfaces between the dielectric layer 116 and the underlying semiconductor regions in each case. Thereafter, the P-cap and N-cap layers are removed from the structure, such as by etching selectively with respect to the underlying dielectric layer 116. Thereafter, the high-K gate dielectric 142 (FIG. 3) is formed overlying the dielectric layer 116 overlying each of the semiconductor regions.

In a variation of method described relative to any of the embodiments and variations thereof described above, the steps of forming the depositing the N-cap and P-cap layers can be performed in a different order so that the N-cap layer 152 (FIG. 5), e.g., a layer including lanthanum, a compound of lanthanum, or a compound of magnesium, is first deposited on the high-k gate dielectric layer 142 overlying the first and second active semiconductor regions, and then a portion of the N-cap layer overlying the second active semiconductor region 130 can be removed. A metal layer such as a TiN layer, for example, can be a part of the P-cap layer 150 (FIG. 5) as described above. After performing the anneal described above with respect to FIG. 6, the first and second workfunction setting metal layers, e.g., the N-cap and P-cap layers, can be removed and processing can continue as described above with respect to FIGS. 7 through 16.

In a further variation of method described relative to any of the embodiments and variations thereof above, the steps of forming the depositing the first and second gate metal layers, e.g., P-gate and N-gate metal layers 160, 168 (FIGS. 7-14) can be performed so that the N-gate metal layer 168 (FIG. 14) is first deposited instead of the P-gate metal layer 160 (FIG. 7), the N-gate metal layer overlying the first and second active semiconductor regions. Then, a barrier metal layer 162, e.g., a TaN layer, and a hard mask layer 164 can be formed overlying the N-gate metal layer 168, similar to the steps described above relative to FIGS. 8-9. Then, the processing described above relative to FIGS. 10-12 can be performed in such way that a portion of the N-gate metal layer overlying the second active semiconductor region 130 can be removed. For example, after depositing a barrier metal layer such as a TaN layer, the first gate metal layer 160 (FIG. 14), e.g., P-gate metal layer, can be deposited to overlie the first and second active semiconductor regions 110, 130, and then processing can continue as described above with respect to FIGS. 7 through 16.

Figure 17:
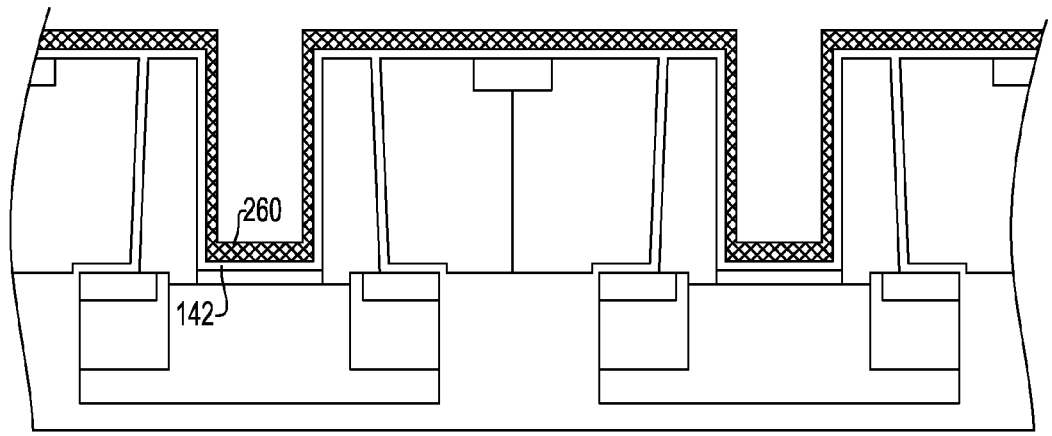
FIG. 17 is a sectional view illustrating a stage subsequent to the stage illustrated in FIG. 3 in a method of fabrication according to a variation of the embodiment of the invention shown in FIGS. 1-16.
Figure 18:
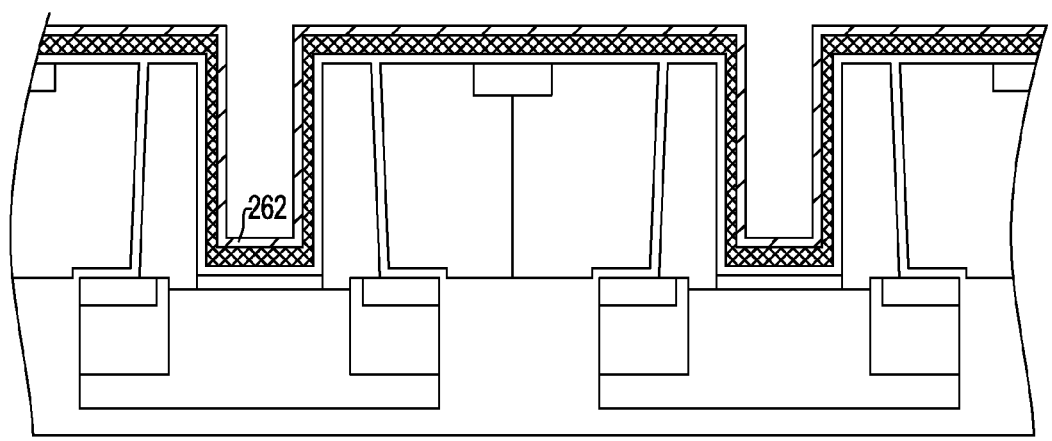
FIG. 18 is a sectional view illustrating a stage subsequent to the stage illustrated in FIG. 17 in a method of fabrication according to an embodiment of the invention.
Figure 19:
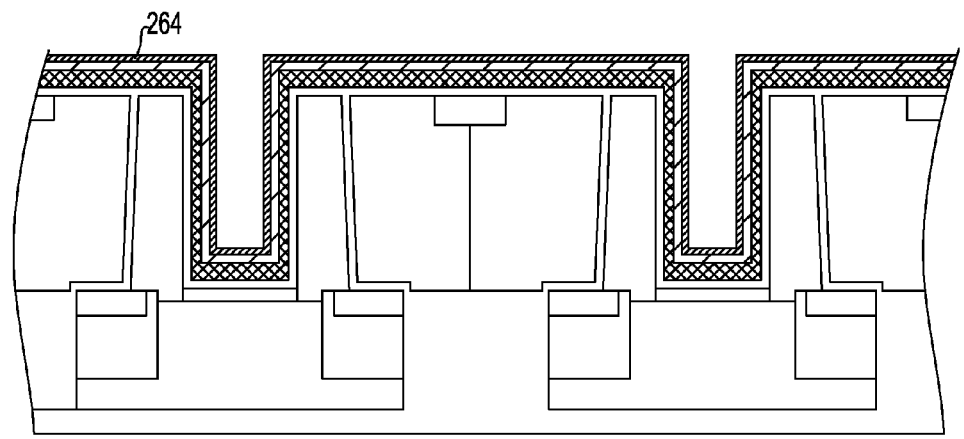
FIG. 19 is a sectional view illustrating a stage subsequent to the stage illustrated in FIG. 18 in a method of fabrication according to an embodiment of the invention.

Referring to FIG. 17, in another variation of the above-described embodiment (FIGS. 1-16), after forming the high-K gate dielectric layer 142 as described above relative to FIG. 3, a first gate metal layer 260, e.g., a P-gate metal layer, can be formed to overlie the gate dielectric layer 142. The P-gate metal layer can be like the P-gate metal layer 160 described above with respect to FIG. 7. Thereafter, as seen in FIG. 18, a barrier metal layer 262 such as a layer of TaN can be formed, e.g., deposited, to cover the P-gate metal layer 260, after which a hard mask layer 264 (FIG. 19), e.g., a layer of silicon oxide or other material, can be deposited or otherwise formed to overlie the barrier metal layer 262.

Figure 20:
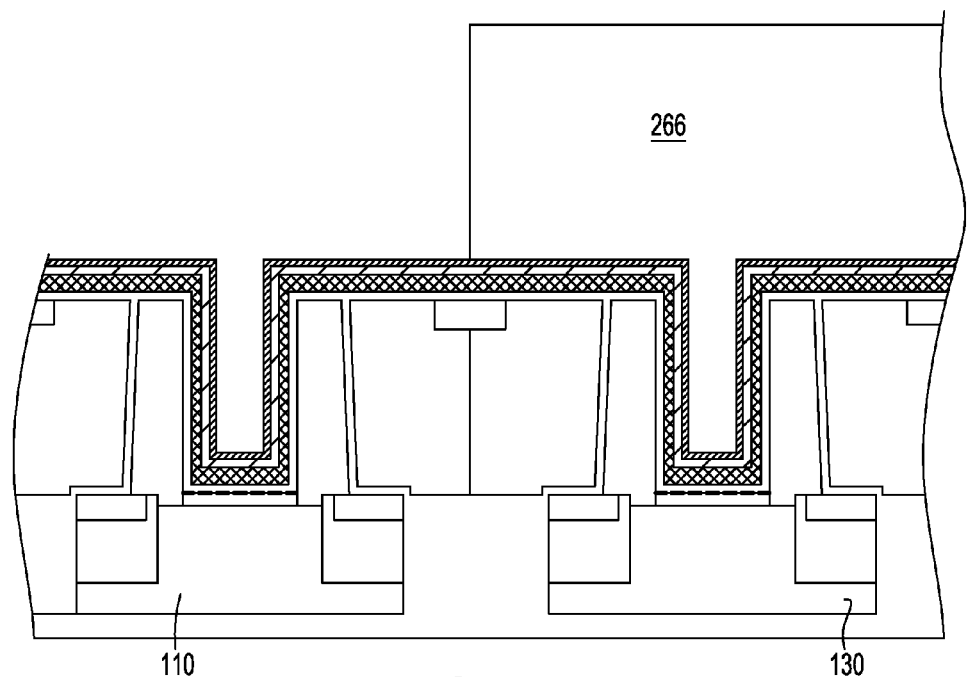
FIG. 20 is a sectional view illustrating a stage subsequent to the stage illustrated in FIG. 19 in a method of fabrication according to an embodiment of the invention.
Figure 21:
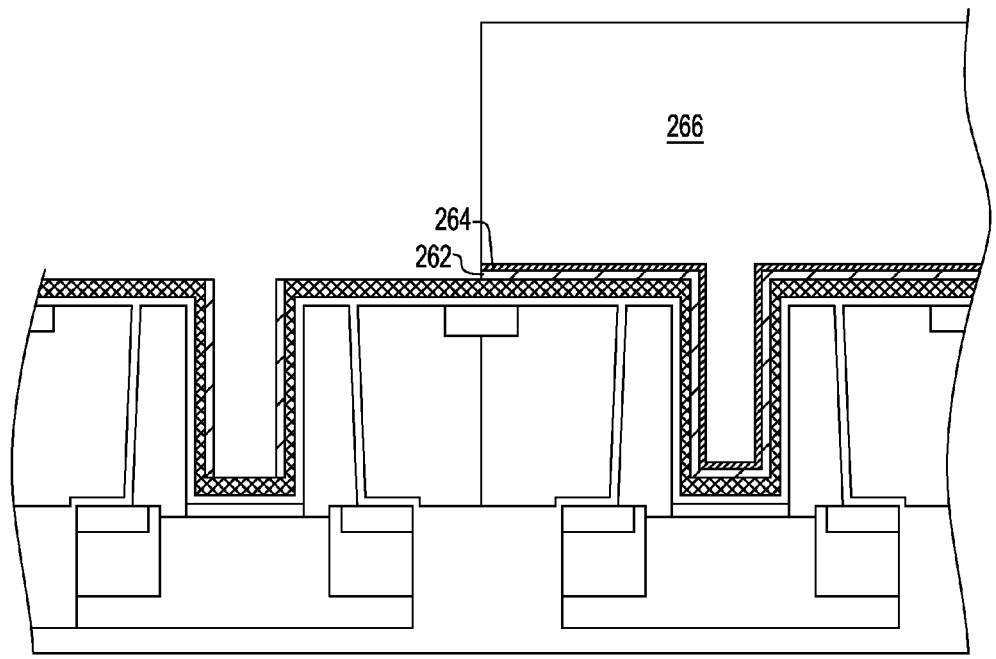
FIG. 21 is a sectional view illustrating a stage subsequent to the stage illustrated in FIG. 20 in a method of fabrication according to an embodiment of the invention.
Figure 22:
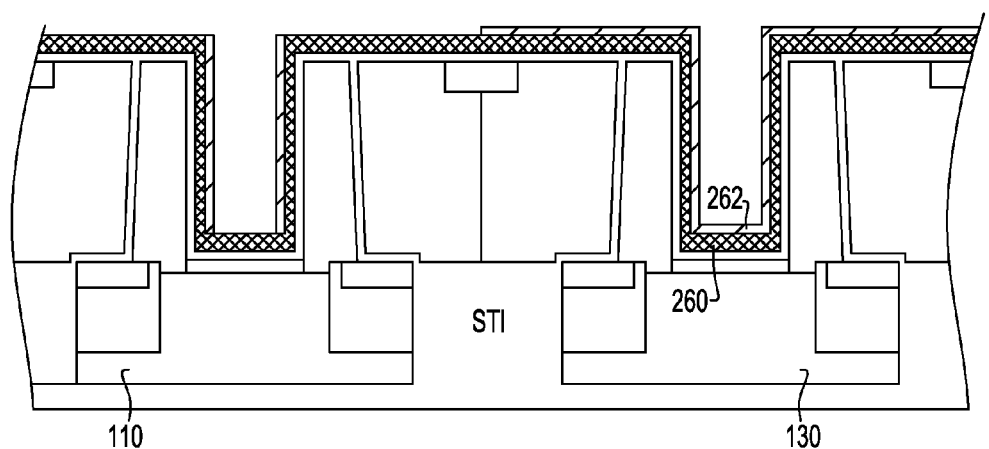
FIG. 22 is a sectional view illustrating a stage subsequent to the stage illustrated in FIG. 21 in a method of fabrication according to an embodiment of the invention.

Then, as shown in FIGS. 20, 21 and 22, the processing as described above with respect to FIGS. 10, 11 and 12 can be performed to form a resist mask 266 and to remove a portion of the hard mask layer 264 and a portion of the barrier metal layer 262 where such layers overlie at least a portion of the first active semiconductor region 110. Such processing results in the structure as seen in FIG. 22 in which the barrier metal layer 262 overlying the P-gate metal layer 262 above the first active semiconductor region 110 has been removed, but the barrier metal layer 262 remains above the P-gate metal layer 262 overlying the second active semiconductor region 130.

Figure 23:
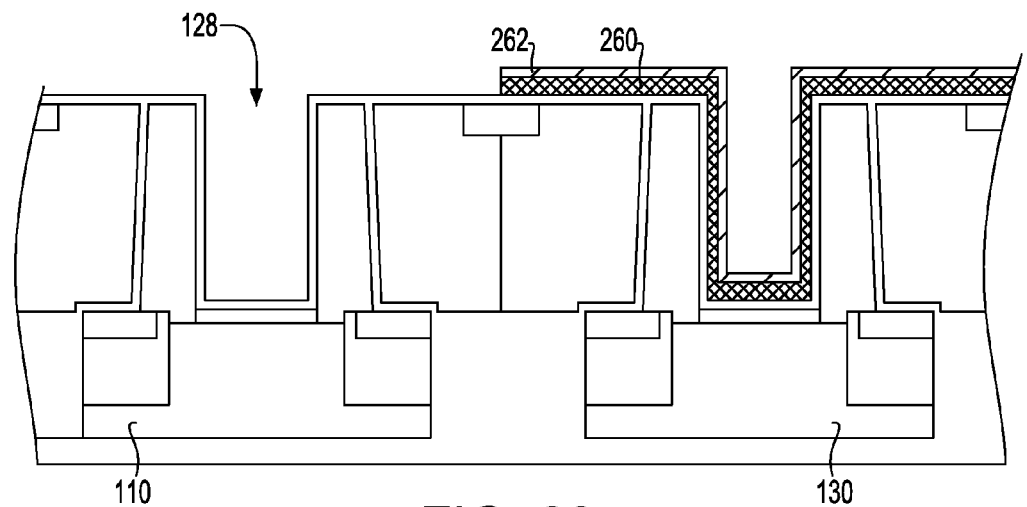
FIG. 23 is a sectional view illustrating a stage subsequent to the stage illustrated in FIG. 22 in a method of fabrication according to an embodiment of the invention.

Thereafter, as seen in FIG. 23, the P-gate metal layer 260, e.g., TiN layer and the barrier metal layer 262, if any, which remains within the opening 128 above the first active semiconductor region 110 can be removed selectively with respect to the barrier metal layer 262 overlying the second active semiconductor region 130, such as by a wet etch process performed to selectively not attack the barrier metal layer 262. The wet etch process is able to remove the barrier metal layer 262 within the opening 128 because the wet etch process can etch the P-gate metal layer 260 underneath the barrier metal layer 262, thus undercutting the barrier metal layer. In time, the barrier metal layer covering the P-gate metal layer 260 within opening 128 washes away as a result of etching the P-gate metal layer 260 thereunder.

Figure 24:
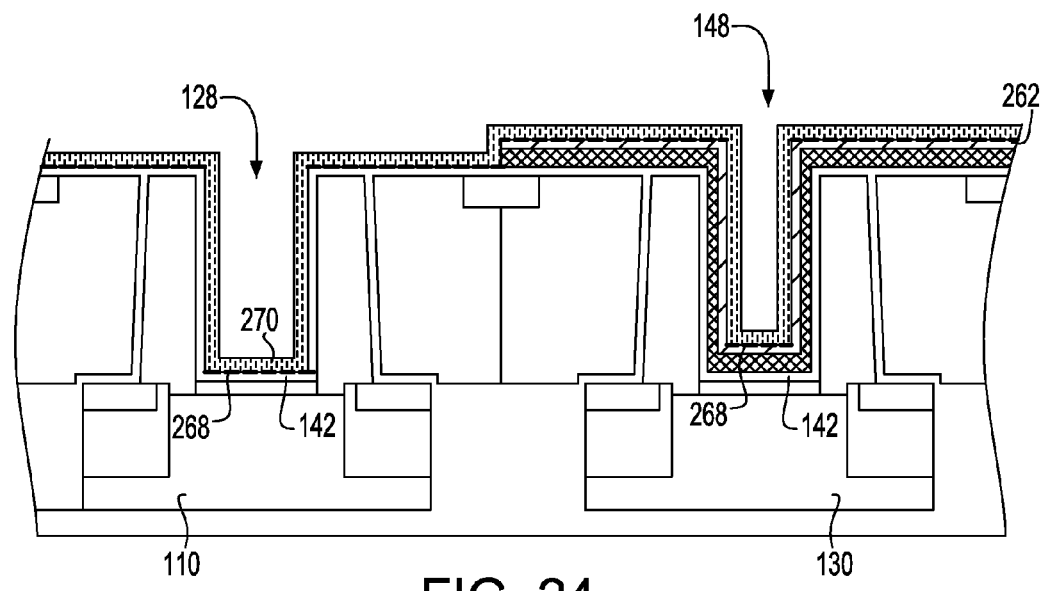
FIG. 24 is a sectional view illustrating a stage subsequent to the stage illustrated in FIG. 23 in a method of fabrication according to an embodiment of the invention.

Subsequently, an N-cap layer 268, e.g., a layer containing lanthanum or a compound of lanthanum, and thereafter an N-gate metal layer 270, for example, aluminum, alloy of titanium and aluminum or other metal, can be deposited to overlie the structure as seen in FIG. 24. With the prior removal of the barrier metal layer 262 from within opening 128, the N-cap layer can be formed adjacent to the high-k gate dielectric layer 142. During subsequent processing, ions from the N-cap layer 268 can diffuse into the high-k gate dielectric layer to enhance a property thereof which is beneficial to operation of an NFET to be formed using the first active semiconductor region 110, such ions reaching locations near an interface between the dielectric layer 142 and the semiconductor region 110. However, the barrier metal layer 262 can prevent ions from the N-cap layer 268 within opening 148 from reaching the high-k gate dielectric 142 overlying the second active semiconductor region 130. Thereafter, the structure as shown in FIG. 24 can be heated to a temperature sufficient to drive ions from the N-cap layer 268 into the high-k gate dielectric layer 142 overlying the first active semiconductor region 110.

Figure 25:
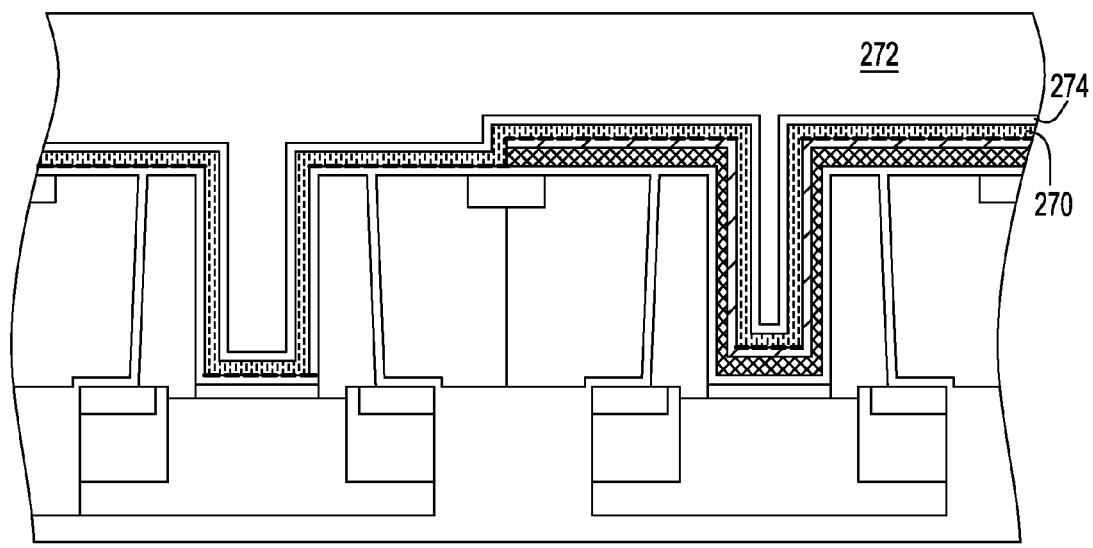
FIG. 25 is a sectional view illustrating a stage subsequent to the stage illustrated in FIG. 24 in a method of fabrication according to an embodiment of the invention.

Thereafter, a metal seal layer, seed layer and then a gate fill layer 272 can be deposited to produce the structure as seen in FIG. 25. In some cases, it may not be necessary to form all such layers. In one example, the structure can be formed using the processing described above with respect to FIG. 15. When a gate fill layer 272 of aluminum is deposited, a layer 274 of TiAl, typically being a relatively thin layer, can be deposited to cover the N-gate metal layer 270 prior to depositing the gate fill layer 272.

Thereafter, the above-described processing (FIG. 16) can be performed to form an ILD layer 172 (FIG. 16) overlying the NFET and PFET similar to that shown in FIG. 16, after which electrically conductive contact vias 174, 176 can be formed which extend through the ILD layer and provide electrically conductive interconnections with the gates and source/drain regions of the NFET and PFET, such as can be made through silicide regions thereof including silicide regions 120.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of simultaneously fabricating n-type and p type field effect transistors, comprising:
    (a) removing first and second sacrificial gates from within first and second openings in a dielectric region overlying first and second active semiconductor regions of a substrate, wherein source/drain regions are disposed within the first and second active semiconductor regions adjacent the first and second openings;
    (b) then forming first and second replacement gates within the first and second openings, respectively, including forming the first replacement gate having a first gate metal layer adjacent a gate dielectric layer within the first opening overlying the first active semiconductor region and forming the second replacement gate having a second gate metal layer adjacent a gate dielectric layer within the second opening overlying the second active semiconductor region, wherein the step of forming includes stacking at least portions of the first and second gate metal layers in a direction of their thicknesses with at least a barrier metal layer separating the at least portions of the gate metal layers; and
    (c) then completing the n-type and p-type field effect transistors, the n-type field effect transistor including the first active semiconductor region, the source/drain regions therein and the first replacement gate, and the p-type field effect transistor including the second active semiconductor region, the source/drain regions therein and the second replacement gate.

2. The method as claimed in claim 1, further comprising, prior to step (a), forming silicide regions on the source/drain regions.

3. The method as claimed in claim 2, further comprising forming at least one dielectric stressor layer after forming the silicide regions, the dielectric stressor layer overlying the silicide regions.

4. The method as claimed in claim 1, wherein step (c) includes forming silicide regions on the source/drain regions.

5. The method as claimed in claim 1, further comprising between steps (a) and (b), heating the substrate having third and fourth different metal layers thereon to a temperature sufficient to drive ions from the third and fourth metal layers simultaneously to locations near interfaces between the first and second active semiconductor regions and the gate dielectric layers, and then removing the third and fourth metal layers.

6. The method as claimed in claim 5, wherein the step of heating the substrate is performed while at least portions of the third and fourth metal layers are stacked in a direction of their thicknesses and separated from each other by at least a second barrier metal layer.

7. The method as claimed in claim 6, wherein the step of heating the substrate is performed while at least a second portion of the third metal layer is not stacked in the direction of its thickness with the fourth metal layer.

8. The method as claimed in claim 7, wherein the step of heating the substrate having the third and fourth metal layers thereon is performed with the third and fourth metal layers overlying the gate dielectric layers, the method further comprising then removing the third and fourth metal layers prior to step (a).

9. The method as claimed in claim 7, further comprising after performing the step of heating and prior to step (a), removing the third and fourth metal layers and then forming the gate dielectric layers.

10. The method as claimed in claim 1, wherein the first metal layer includes aluminum and the second metal layer includes lanthanum.

11. The method as claimed in claim 1, wherein step (b) includes forming the first gate metal layer adjacent to the gate dielectric layer overlying at least portions of the first and second active semiconductor regions and then removing the first gate metal layer overlying a portion of the second active semiconductor region.

12. The method as claimed in claim 1, wherein step (b) includes forming the second gate metal layer adjacent to the gate dielectric layers overlying at least portions of the first and second active semiconductor regions and then removing the second gate metal layer overlying a portion of the first active semiconductor region.

13. The method as claimed in claim 7, wherein the step of heating the substrate having the third and fourth metal layers thereon is performed with the third and fourth metal layers overlying the gate dielectric layers, and step (b) includes forming the first and second gate metal layers overlying at least the third and fourth metal layers, respectively.

14. A microelectronic element including a semiconductor chip, comprising:
an n-type field effect transistor (NFET) having a current path in a monocrystalline semiconductor region of the semiconductor chip, and having a gate consisting essentially of at least one of a metal or a conductive metal compound other than a silicide, the gate having a first metal layer adjacent a gate dielectric layer of the NFET; and
a p-type field effect transistor (PFET) having a current path in a monocrystalline region of the semiconductor chip, and having a gate consisting essentially of at least one of a metal or a conductive metal compound other than a silicide, the gate having a second metal layer adjacent a gate dielectric layer of the PFET,
wherein the gate of at least one of the NFET and the PFET includes both the first metal and the second metal and a barrier metal layer separating the first metal from the second metal.

15. The microelectronic element as claimed in claim 14, wherein the gate dielectric layer of the NFET further includes first ions of a third metal therein, and the gate dielectric layer of the PFET further includes second ions of a fourth metal therein, the fourth metal being different from the third metal.

16. The microelectronic element as claimed in claim 14, wherein the gate dielectric layers of the NFET and the PFET include at least one material having a dielectric constant greater than a dielectric constant of silicon nitride.

17. The microelectronic element as claimed in claim 15, wherein the gates of the NFET and the PFET further include a fifth metal, the fifth metal overlying at least one of the first and second metals in each gate.

18. The microelectronic element as claimed in claim 17, wherein the gate of another one of the NFET or PFET transistors other than the at least one of the NFET or PFET transistors includes only one of the first metal or the second metal.

19. A microelectronic element including a semiconductor chip, comprising:
an n-type field effect transistor (NFET) having a current path in a monocrystalline semiconductor region of the semiconductor chip, and having a gate consisting essentially of at least one of a metal or a conductive metal compound other than a silicide, the gate having a first metal layer adjacent a gate dielectric layer of the NFET, the NFET gate dielectric layer including first ions of a first metal; and
a p-type field effect transistor (PFET) having a current path in a monocrystalline region of the semiconductor chip, and having a gate consisting essentially of at least one of a metal or a conductive metal compound other than a silicide, the gate having a second metal layer adjacent a gate dielectric layer of the PFET, the PFET gate dielectric layer including second ions of a second metal,
wherein the gate of at least one of the NFET or the PFET includes the first and second metal layers and a barrier metal layer separating the first metal layer from the second metal layer.

20. The microelectronic element as claimed in claim 19, wherein the gate of the at least one of the NFET or the PFET further includes a third layer including a metal or an electrically conductive compound of a metal, wherein the barrier metal layer separates the second metal layer from the third layer.

21. The microelectronic element as claimed in claim 20, wherein the first metal layer is disposed adjacent to the gate dielectric of the NFET, the first metal layer includes lanthanum, and the second metal layer includes aluminum.

* * * * *